(12) United States Patent
Kozaki (10) Patent No.: US 6,677,825 B2
(45) Date of Patent: Jan. 13, 2004

(54) RING OSCILLATOR CIRCUIT AND A DELAY CIRCUIT

(75) Inventor: Minoru Kozaki, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/151,477

(22) Filed: May 20, 2002

(65) Prior Publication Data

US 2002/0190798 A1 Dec. 19, 2002

(30) Foreign Application Priority Data

May 22, 2001 (JP) ........................................ 2001-153247
Feb. 20, 2002 (JP) ........................................ 2002-043313

(51) Int. Cl.[7] .................................................. H03B 1/00
(52) U.S. Cl. ..................... 331/57; 331/175; 331/177 R; 327/266; 327/274
(58) Field of Search ......................... 331/57, 177 R, 331/175; 327/266, 274

(56) References Cited

U.S. PATENT DOCUMENTS 5,477,198 A    12/1995  Anderson et al. ........ 331/177 R
6,271,730 B1 *  8/2001  Abe et al. ..................... 331/34

* cited by examiner

Primary Examiner—Arnold Kinkead
(74) Attorney, Agent, or Firm—Harness, Dickey & Pierce, P.L.C.

(57) ABSTRACT

The ring oscillator circuit is made by connecting K units of inverter circuits U11, U12, . . . , U1K in a ring shape. The inverter circuit U11 comprises a CMOS inverter IV1 which includes MOS transistors MP4 and MN4, a P-channel MOS transistor MP3 which functions as the current source for a CMOS inverter IV1, an N-channel MOS transistor MN3 which functions as the current source for a CMOS inverter IV1, and a CMOS inverter IV2 which is connected in parallel to the CMOS inverter IV1 and includes MOS transistors MP5 and MN5.

12 Claims, 6 Drawing Sheets

RING OSCILLATOR CIRCUIT AND A DELAY CIRCUIT

BACKGROUND OF THE INVENTION

1. Field of Technology of the Invention

The present invention relates to ring oscillator circuits such as variable frequency type ring oscillator circuits and delay circuits such as variable delay circuits, and provides ring oscillator circuits with low power supply voltage dependency of the oscillation frequency and delay circuits with low power supply voltage dependency of the delay time.

2. Prior Art Technology

Figure 5:
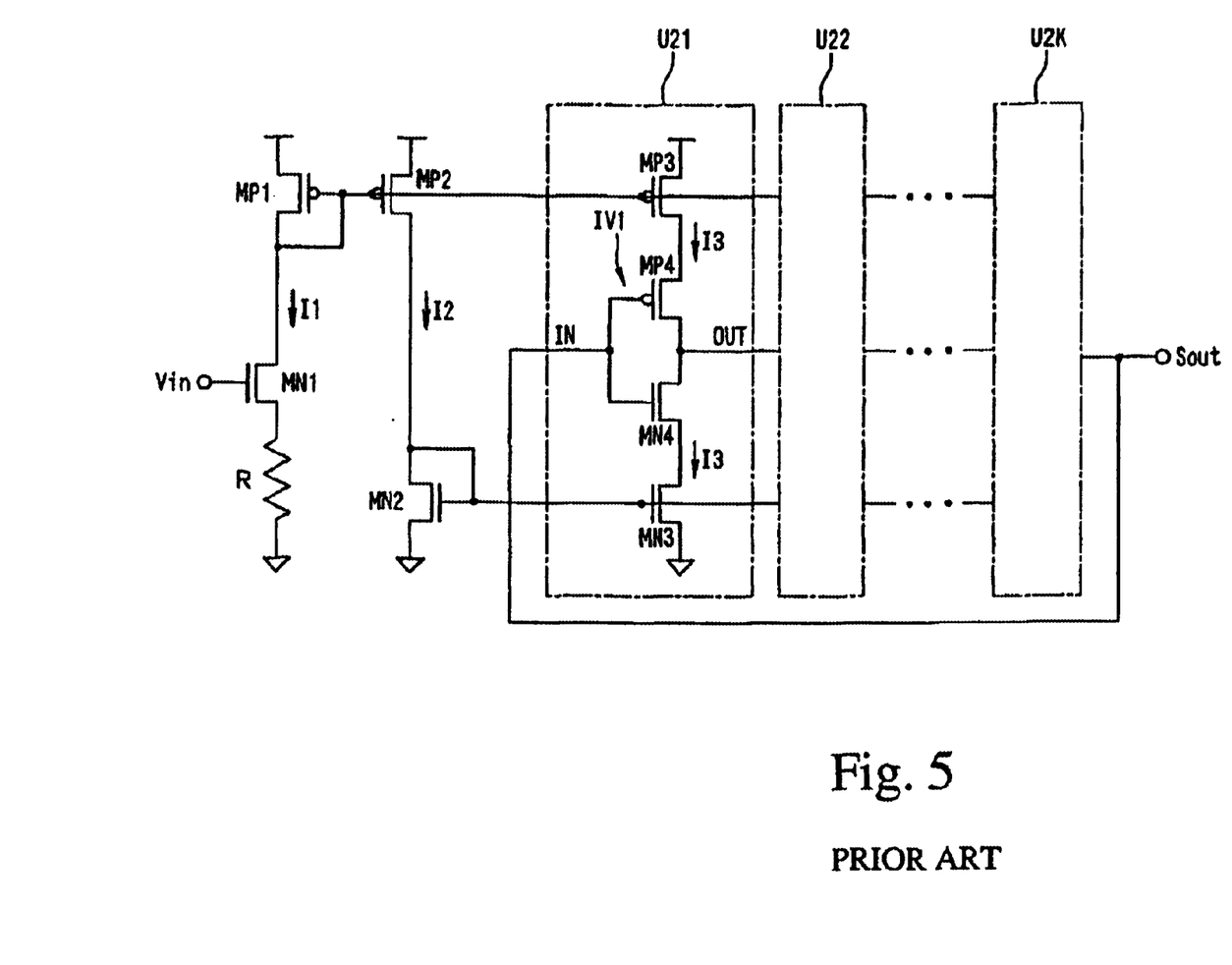
FIG. 5 is a circuit diagram showing the configuration of a conventional variable frequency type ring oscillator circuit.

FIG. 5 is a diagram showing an example of a conventional variable frequency type ring oscillator circuit. In FIG. 5, Vin indicates a control voltage for controlling the oscillation frequency, and Sout an oscillation output.

The ring oscillator circuit comprises K units of inverter circuits U21, U22, . . . , U2K connected in a ring shape. In this instance, K is an odd number such as 3, 5, 7, . . . .

In FIG. 5, although the internal configurations of the inverter circuits U22, . . . , U2K are omitted except for the first-stage inverter circuit U21, all have the same circuit configuration as the first-stage inverter circuit U21.

The inverter circuit U21, as shown in FIG. 5, is equipped with a CMOS inverter IV1 including a P-channel MOS transistor MP4 and an N-channel MOS transistor MN4, and with a P-channel MOS transistor MP3 and an N-channel MOS transistor MN3 which function as the current source for the CMOS inverter IV1.

Specifically, the P-channel MOS transistor MP4 has its gate terminal connected to an input terminal (IN) of the inverter circuit U21, its drain terminal connected to an output terminal (OUT) of the inverter circuit U21, and its source terminal connected to the power supply potential via the P-channel MOS transistor MP3. The N-channel MOS transistor MN4 has its gate terminal connected to an input terminal (IN) of the inverter circuit U21, its drain terminal connected to an output terminal (OUT) of the inverter circuit U21, and its source terminal connected to the ground potential via the N-channel MOS transistor MN3.

The P-channel MOS transistor MP3 and N-channel MOS transistor MN3 that function as the current source for the CMOS inverter IV1 are configured so that their current values can be varied by a control voltage Vin. This configuration is explained below.

Namely, an N-channel MOS transistor MN1 forms a source follower and generates at both ends of a resistor R a voltage value which is approximately equal to the voltage (Vin−Vt) of the control voltage Vin with the threshold voltage Vt of the MOS transistor MN1 subtracted. Hence, a current I1=(Vin−Vt)/R which varies according to the control voltage Vin flows in the N-channel MOS transistor MN1 and the P-channel MOS transistor MP1.

The P-channel MOS transistors MP1 and MP2 constitute current mirrors. Hence, a current I2 equal to the current I1 also flows in the P-channel MOS transistor MP2 and the N-channel MOS transistor MN2. Furthermore, the P-channel MOS transistors MP1 and MP3, and the N-channel MOS transistors MN2 and MN3 also constitute current mirrors. Therefore, the P-channel MOS transistor MP3 and the N-channel MOS transistor MN3 both become a current source that outputs a current I3 equal to the current I1.

An example of operations of a conventional variable frequency type ring oscillator circuit shown in FIG. 5 is described next.

If a voltage signal at the "L" level is input to the input terminal (IN) of the inverter circuit U21, the P-channel MOS transistor MP4 constituting a switching unit turns ON, the N-channel transistor MN4 turns OFF, and a current I3 is output from the output terminal (OUT). Conversely, if a voltage signal at the "H" level is input to the input terminal (IN) of the inverter circuit U21, the P-channel MOS transistor MP4 turns OFF, the N-channel transistor MN4 turns ON, and a current I3 is drawn in through the output terminal (OUT).

The propagation delay time $\tau$ of the inverter circuit U21 is expressed by the following approximation formula:

$$\tau = C(Vdd/2)/I3 \quad (1)$$

where C indicates the output capacitance of the inverter circuit U21, and Vdd the power supply voltage. Hence, the oscillation frequency f of the variable frequency type ring oscillator circuit in FIG. 5 is given by the following equation:

$$f = 1/(2K\cdot\tau) = I3/(K\cdot C\cdot Vdd) \quad (2)$$

where K indicates the number of connections of the inverter circuit.

Therefore, the ring oscillator circuit has a mechanism where the oscillation frequency f can be varied by making the current I3 of the current source variable, namely by making the control voltage Vin variable.

Figure 6:
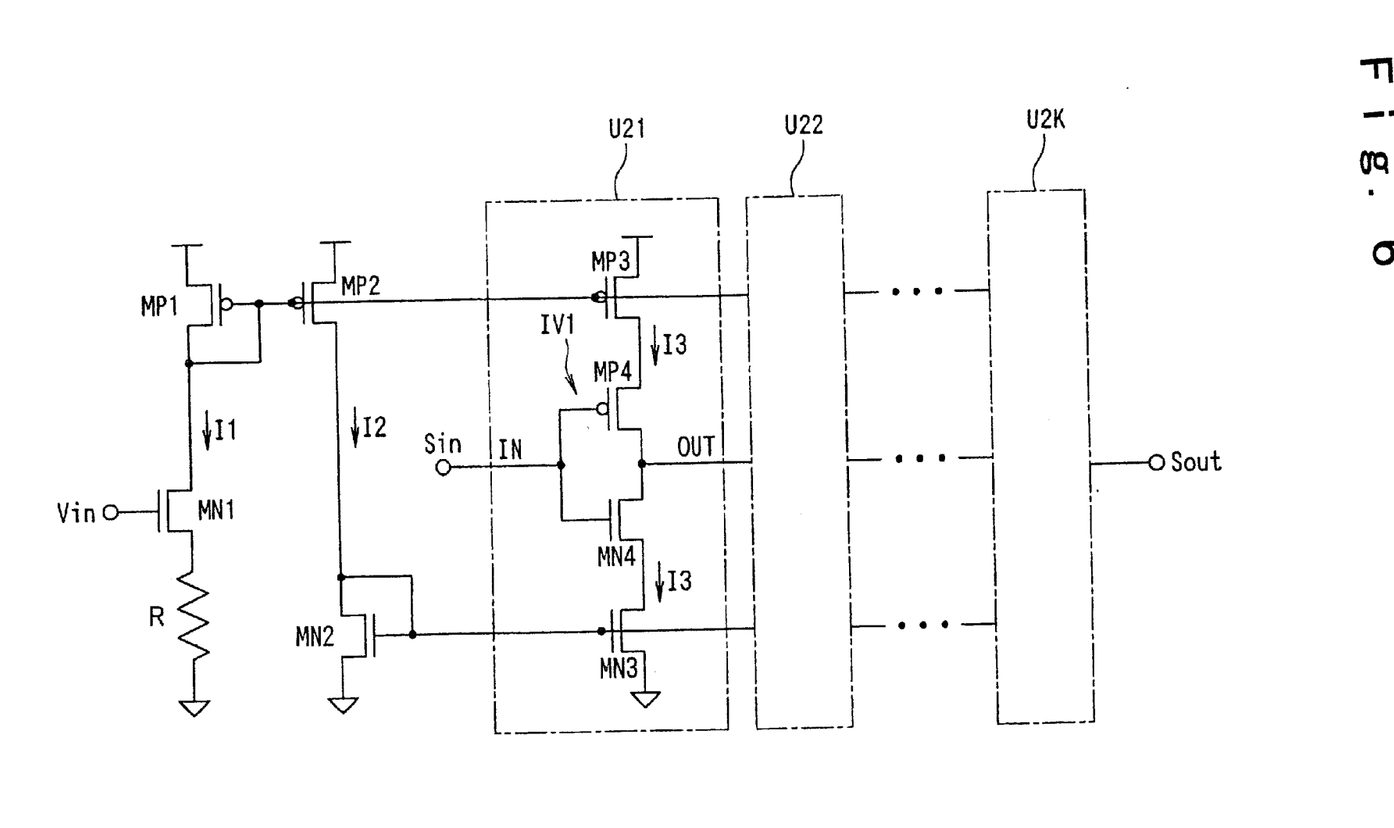
FIG. 6 is a circuit diagram showing the configuration of a conventional variable delay circuit.

FIG. 6 is a figure showing an example of conventional variable delay circuits. In FIG. 6, Sin indicates an input signal, and Sout a delay output signal.

As shown in FIG. 6, the delay circuit comprises K units of inverter circuits U21, U22, . . . , U2K connected in cascade.

In this instance, the delay circuit is completely the same with the variable frequency type ring oscillation circuit in a configuration other than the point that the output of the last-stage inverter circuit U2K is not fed back to the first-stage inverter circuit U21. Therefore, a detailed explanation is omitted.

In a delay circuit having such a configuration, because the propagation delay time $\tau$ of the inverter circuit U21 is given by the formula (1), its delay time t becomes as shown in the following formula:

$$t = K\cdot\tau = K\cdot C(Vdd/2)/I3 \quad (3)$$

Therefore, the delay circuit has a mechanism where the delay time t can be varied by making the current I3 of the current source variable, namely making the control voltage Vin variable.

In conventional variable frequency type ring oscillator circuits and variable delay circuits, as stated earlier, the propagation delay time $\tau$ of each inverter circuit is an amount proportional to the power supply voltage Vdd.

As the result, in a variable frequency type ring oscillator circuit, the oscillation frequency f varies in inverse proportion to the power supply voltage Vdd. Also, in a variable delay circuit, the delay time t varies in proportion to the power supply voltage Vdd.

Therefore, there has been an inconvenience with conventional variable frequency type ring oscillator circuits and conventional variable delay circuits in that a fluctuation occurs to the oscillation frequency f or delay time t if the power supply voltage Vdd varies along with the operations of the peripheral circuit.

Hence, if a variable frequency type ring oscillator circuit is used in a PLL (phase locked loop) or if a variable delay circuit is used in a DLL (delay locked loop) for example, the phase of the signal fluctuates due to a variation of the power supply voltage Vdd, decreasing the operation reliability of any system using these circuits.

The first objective of the present invention is to provide a ring oscillator circuit that can reduce the power supply voltage dependency of the oscillation frequency.

Also, the second objective of the present invention is to provide a delay circuit that can reduce the power supply voltage dependency of the delay time.

SUMMARY OF THE INVENTION

In order to overcome these problems and to achieve the first objective of the present invention, the inventions described in claim 1–claim 4 are configured as follows.

The invention described in claim 1 is a ring oscillator circuit comprising an odd number of inverter circuits connected in a ring shape. The inverter circuit contains a first switching unit which includes at least two MOS transistors, a current source for the first switching unit, and the second switching unit which is installed in parallel to the first switching unit and includes at least two MOS transistors. The first switching unit and the second switching unit have their input terminals in a common connection and their output terminals in a common connection.

The invention described in claim 2 is a ring oscillator circuit comprising an odd number of inverter circuits connected in a ring shape. The inverter circuit contains a first CMOS inverter, a current source for the first CMOS inverter, and a second CMOS inverter which is installed in parallel to the first CMOS inverter. The first CMOS inverter and the second CMOS inverter have their input terminals in a common connection and their output terminals in a common connection.

The invention described in claim 3 is a ring oscillator circuit comprising an odd number of inverter circuits connected in a ring shape. The inverter circuit contains a first differential inverter which includes a pair of CMOS inverters, a current source for the first differential inverter, and a second differential inverter which is installed in parallel to the first differential inverter and includes a pair of CMOS inverters. The first differential inverter and the second differential inverter have their input terminals in a common connection and their output terminals in a common connection.

The invention described in claim 4 is a ring oscillator circuit described in one of the claims 1–3, where the current source is made capable of varying its current.

By having the ring oscillator circuit of the present invention have such a configuration, it becomes possible to make the rate of change in oscillation frequency against change of the power supply voltage zero near the operating point. Therefore, even if the power supply voltage varies somewhat, the oscillation frequency never varies.

In order to achieve the second objective of the present invention, the inventions described in claim 5–claim 8 are configured as follows.

The invention described in claim 5 is a delay circuit comprising a plural number of inverter circuits connected in cascade. The inverter circuit contains a first switching unit including at least two MOS transistors, a current source for the first switching unit, and a second switching unit which is installed in parallel to the first switching unit and includes at least two MOS transistors. The first switching unit and the second switching unit have their input terminals in a common connection and their output terminals in a common connection.

The invention described in claim 6 is a delay circuit comprising a plural number of inverter circuits connected in cascade. The inverter circuit contains a first CMOS inverter, a current source for the first CMOS inverter, and a second CMOS inverter which is installed in parallel to the first CMOS inverter. The first CMOS inverter and the second CMOS inverter have their input terminals in a common connection and their output terminals in a common connection.

The invention described in claim 7 is a delay circuit comprising a plural number of inverter circuits connected in cascade. The inverter circuit contains a first differential inverter including a pair of CMOS inverters, a current source for the first differential inverter, and a second differential inverter which is installed in parallel to the first differential inverter and includes a pair of CMOS inverters. The first differential inverter and the second differential inverter have their input terminals in a common connection and their output terminals in a common connection.

The invention described in claim 8 is a delay circuit described in one of the claims 5–7, where the current source is made capable of varying its current.

By having the delay circuit of the present invention have such a configuration, it becomes possible to make the rate of change in delay time against change of the power supply voltage zero near the operating point. Therefore, even if the power supply voltage varies somewhat, the delay time never varies.

DETAILED DESCRIPTION OF THE PREFERRED EMBODIMENTS OF THE INVENTION

Embodiments of the present invention are explained hereafter, with reference to the drawings.

Figure 1:
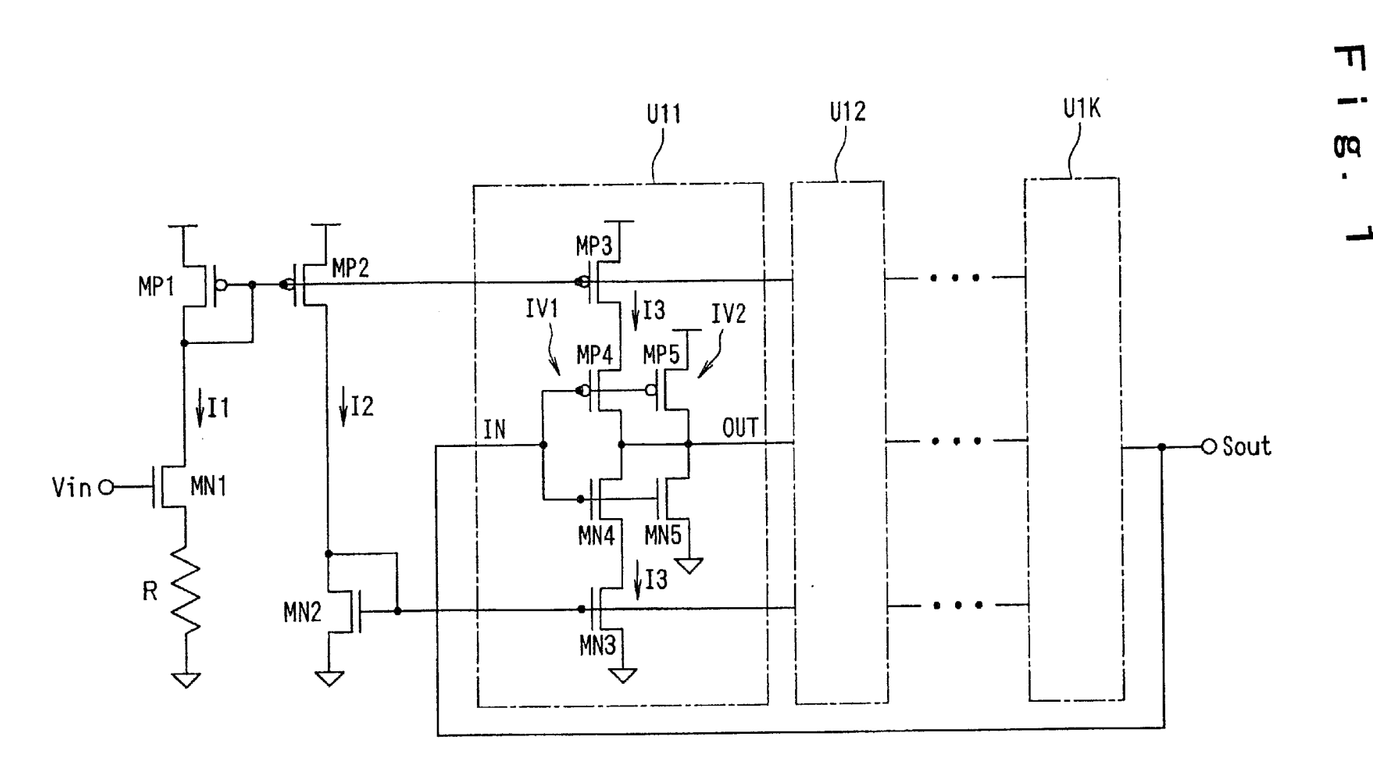
FIG. 1 is a circuit diagram showing the configuration of the first embodiment of the ring oscillator circuit of the present invention.

FIG. 1 is a circuit diagram showing the circuit configuration of the first embodiment of the ring oscillator circuit of the present invention.

The first embodiment of the ring oscillator circuit employs K units of inverter circuits U11, U12, . . . , U1K connected in a ring shape, and is a ring oscillator circuit of the variable frequency type.

In other words, as shown in FIG. 1, the ring oscillator circuit is made by connecting K units of inverter circuits U11, U12, . . . , U1K in cascade, and feeding the output of the last-stage inverter circuit U1K back to the first-stage inverter circuit U11 so that it self-oscillates.

Although the internal configurations of the inverter circuits U12, ..., U1K are omitted except for the first-stage inverter circuit U11 in FIG. 1, each has an identical circuit configuration to that of the first-stage inverter circuit U11. Therefore, only the configuration of the inverter circuit U11 is explained below.

The inverter circuit U11 is equipped with a CMOS inverter IV1 which is the first switching unit, a P-channel MOS transistor MP3 which functions as a current source for the CMOS inverter IV1, an N-channel MOS transistor MN3 which functions as a current source for the CMOS inverter IV1, and a CMOS inverter IV2 which is connected in parallel to the CMOS inverter IV1 and is the second switching unit.

The CMOS inverter IV1 comprises a P channel MOS transistor MP4 and an N-channel MOS transistor MN4.

Namely, the P-channel MOS transistor MP4 has its gate terminal connected to the input terminal (IN) of the inverter circuit U11, its drain terminal connected to the output terminal (OUT) of the inverter circuit U11, and its source terminal connected to the power supply potential via the P-channel MOS transistor MP3. The N-channel MOS transistor MN4 has its gate terminal connected to the input terminal (IN) of the inverter circuit U11, its drain terminal connected to the output terminal (OUT) of the inverter circuit U11, and its source terminal connected to the ground potential via the N-channel MOS transistor MN3.

The CMOS inverter IV2 comprises a P channel MOS transistor MP5 and an N-channel MOS transistor MN5.

Namely, the P-channel MOS transistor MP5 has its gate terminal connected to the input terminal (IN) of the inverter circuit U11, its drain terminal connected to the output terminal (OUT) of the inverter circuit U11, and its source terminal connected to the power supply potential.

The N-channel MOS transistor MN5 has its gate terminal connected to the input terminal (IN) of the inverter circuit U11, its drain terminal connected to the output terminal (OUT) of the inverter circuit U11, and its source terminal connected to the ground potential.

As can be seen from the above, the CMOS inverters IV1 and IV2 have their input terminals in a common connection, and also the common connection unit is connected to the input terminal (IN) of the inverter circuit U11. Also, the CMOS inverters IV1 and IV2 have their output terminals in a common connection, and also the common connection unit is connected to the output terminal (OUT) of the inverter circuit U11.

As shown in FIG. 1, the P-channel MOS transistors MP1, MP2, and MP3 constitute current mirrors. Also, the N-channel MOS transistors MN2 and MN3 constitute current mirrors. Furthermore, an N-channel MOS transistor MN1 is connected to a P-channel MOS transistor MP1 in series, so that a control voltage Vin is supplied to its gate terminal.

Hence, the P-channel MOS transistor MP3 and the N-channel MOS transistor MN3 both become a current source that outputs a current I3 equal to a current I1. Also, the current I3 can be varied by varying the control voltage Vin.

The operation of the first embodiment of the ring oscillation circuit made of such a configuration is explained next.

If a voltage signal at the "L" level is input to the input terminal (IN) of the inverter circuit U11, the P-channel MOS transistors MP4 and MP5 turn ON, and the N-channel transistors MN4 and MN5 turn OFF. At this time, the current Ip which flows in the P-channel MOS transistor MP5 is given by the following formula (4):

$$Ip = (\beta/2)(Vdd - Vt)^2 \qquad (4)$$

where $\beta$ is a transconductance parameter of the P-channel MOS transistor MP5 and is a value which can be set arbitrarily by changing the size of the transistor.

At this time, together with the current I3 which flows in the P-channel MOS transistor MP4, the following current I is output from the output terminal (OUT) of the inverter circuit U11:

$$I = I3 + (\beta/2)(Vdd - Vt)^2 \qquad (5)$$

Conversely, if a voltage signal at the "H" level is input to the input terminal (IN) of the inverter circuit U11, the P-channel MOS transistors MP4 and MP5 turn OFF, and the N-channel transistors MN4 and MN5 turn ON. At this time, the current In which flows in the N-channel MOS transistor MN5 is given by the following formula (6).

$$In = (\beta/2)(Vdd - Vt)^2 \qquad (6)$$

where $\beta$ is a transconductance parameter of the N-channel MOS transistor MN5 and is a value identical to that of the P-channel MOS transistor MP5.

At this time, together with the current I3 which flows in the N-channel transistor MN4, the following current I is drawn into the output terminal (OUT) of the inverter circuit U11.

$$I = I3 + (\beta/2)(Vdd - Vt)^2 \qquad (7)$$

Therefore, the propagation delay time $\tau$ of the inverter circuit U11 is expressed by the following approximation formula:

$$\tau = C(Vdd/2)/I \qquad (8)$$
$$= C(Vdd/2)/\{I3 + (\beta/2)(Vdd - Vt)^2\}$$

The oscillator frequency f of the variable frequency type ring oscillation circuit in FIG. 1 is given by the following formula.

$$f = 1/(2K \cdot \tau) \qquad (9)$$
$$= \{I3 + (\beta/2)(Vdd - Vt)^2\}/(K \cdot C \cdot Vdd)$$

In this instance, if we calculate a condition where $\partial f/\partial Vdd = 0$ holds true, the following formula is obtained:

$$\beta = (2 \times I3)/(Vdd^2 - Vt^2) \qquad (10)$$

Namely, by setting the value of the transconductance parameter $\beta$ of the P-channel MOS transistor MP5 and N-channel MOS transistor MN5 to satisfy the above formula, it becomes possible to make the rate of variation of the oscillation frequency f against changes in the power supply voltage Vdd be zero. In a ring oscillator circuit designed in this way, even if the power supply voltage Vdd varies somewhat, the oscillation frequency f never varies.

Hence, when a variable frequency type ring oscillator circuit designed in this way is used in a PLL (phase-locked loop) circuit, for example, and the power supply voltage Vdd varies along with operation of the peripheral circuit, the signal phase never fluctuates. Thus, it is possible to improve operational reliability of a system that uses the PLL circuit.

Figure 2:
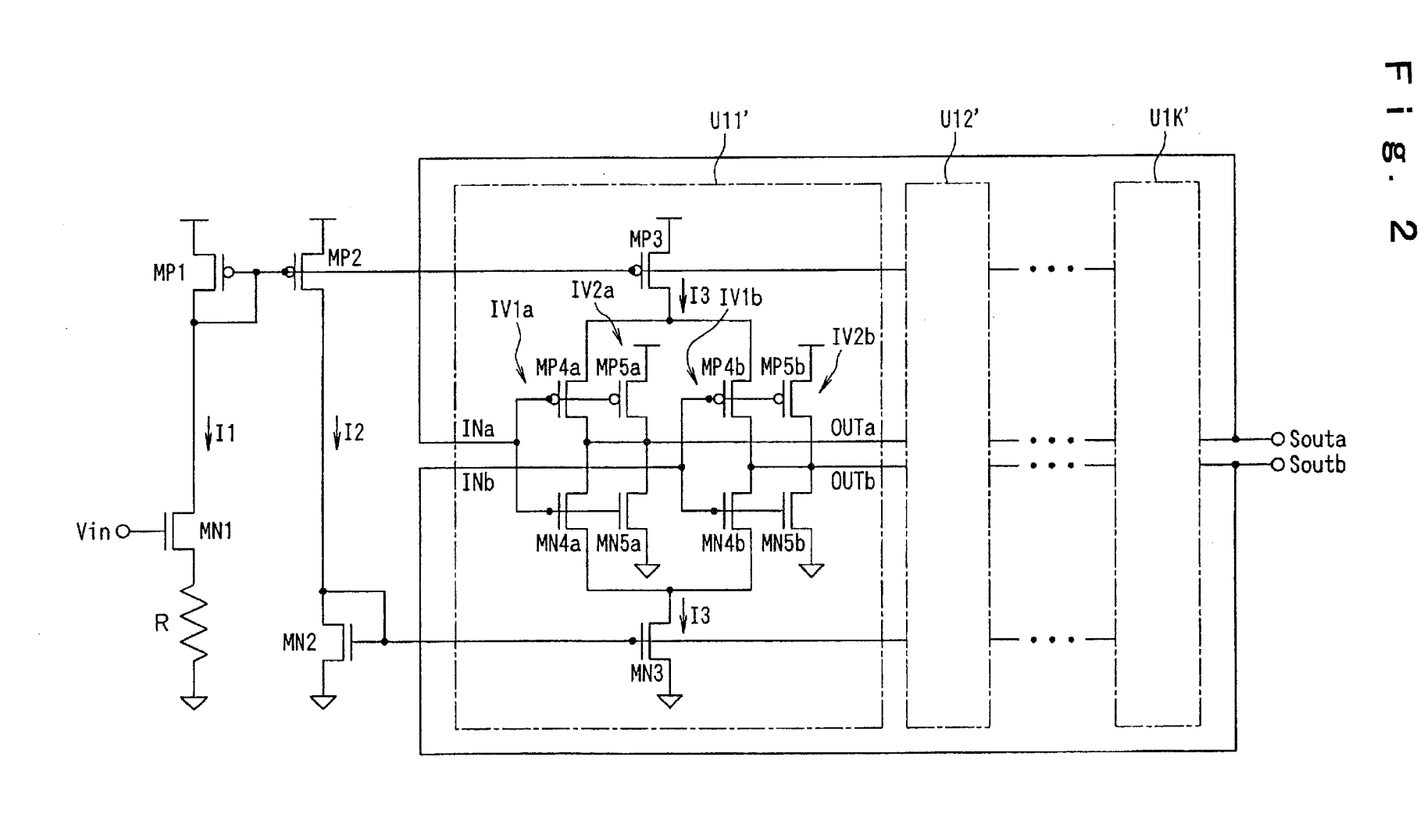
FIG. 2 is a circuit diagram showing the configuration of the second embodiment of the ring oscillator circuit of the present invention.

The circuit configuration of the second embodiment of the ring oscillator circuit of the present invention is explained hereafter, with reference to FIG. 2.

The second embodiment of the ring oscillator circuit employs K units of differential inverter circuits U11', U12', ..., U1K' connected in a ring shape, and is a ring oscillator circuit of the variable frequency type.

As shown in FIG. 2, the second embodiment is made by replacing the inverter circuits U11, U12, ..., U1K of the first embodiment shown in FIG. 1 with differential inverter circuits U11', U12', ..., U1K'.

Although the internal configurations of the inverter circuits U12', ..., U1K' are omitted except for the first-stage inverter circuit U11' in FIG. 2, each has an identical circuit configuration to that of the first-stage inverter circuit U11'. Also, in the second embodiment, the current source configuration is identical to the current source configuration of the first embodiment shown in FIG. 1. Therefore, explanations are made mainly on the configuration of the inverter circuit U11' below.

As shown in FIG. 2, the inverter circuit U11' is equipped with a first differential inverter which includes a CMOS inverter IV1a and a CMOS inverter IV1b, a P-channel MOS transistor MP3 which functions as a current source for the first differential inverter, an N-channel MOS transistor MN3 which functions as a current source for the first differential inverter, and a second differential inverter which includes a CMOS inverter IV2a connected in parallel to the CMOS inverter IV1a and a CMOS inverter IV2b connected in parallel to the CMOS inverter IV1b.

The CMOS inverter IV1a comprises a P channel MOS transistor MP4a and an N-channel MOS transistor MN4a.

Namely, the P-channel MOS transistor MP4a has its gate terminal connected to an input terminal (INa) of the inverter circuit U11', its drain terminal connected to an output terminal (OUTa) of the inverter circuit U11', and its source terminal connected to the power supply potential via the P-channel MOS transistor MP3. The N-channel MOS transistor MN4a has its gate terminal connected to the input terminal (INa) of the inverter circuit U11', its drain terminal connected to the output terminal (OUTa) of the inverter circuit U11', and its source terminal connected to the ground potential via the N-channel MOS transistor MN3.

The CMOS inverter IV1b comprises a P channel MOS transistor MP4b and an N-channel MOS transistor MN4b.

Namely, the P-channel MOS transistor MP4b has its gate terminal connected to the input terminal (INb) of the inverter circuit U11', its drain terminal connected to the output terminal (OUTb) of the inverter circuit U11', and its source terminal connected to the power supply potential via the P-channel MOS transistor MP3. The N-channel MOS transistor MN4b has its gate terminal connected to the input terminal (INb) of the inverter circuit U11', its drain terminal connected to the output terminal (OUTb) of the inverter circuit U11', and its source terminal connected to the ground potential via the N-channel MOS transistor MN3.

The CMOS inverter IV2a comprises a P channel MOS transistor MP5a and an N-channel MOS transistor MN5a.

Namely, the P-channel MOS transistor MP5a has its gate terminal connected to the input terminal (INa) of the inverter circuit U11', its drain terminal connected to the output terminal (OUTa) of the inverter circuit U11', and its source terminal connected to the power supply potential. The N-channel MOS transistor MN5a has its gate terminal connected to the input terminal (INa) of the inverter circuit U11', its drain terminal connected to the output terminal (OUTa) of the inverter circuit U11', and its source terminal connected to the ground potential.

The CMOS inverter IV2b comprises a P channel MOS transistor MP5a and an N-channel MOS transistor MN5b.

Namely, the P-channel MOS transistor MP5b has its gate terminal connected to the input terminal (INb) of the inverter circuit U11', its drain terminal connected to the output terminal (OUTb) of the inverter circuit U11', and its source terminal connected to the power supply potential. The N-channel MOS transistor MN5b has its gate terminal connected to the input terminal (INb) of the inverter circuit U11', its drain terminal connected to the output terminal (OUTb) of the inverter circuit U11', and its source terminal connected to the ground potential.

The operation of the second embodiment of the ring oscillator circuit with such a configuration is explained next.

Assuming that a voltage signal at the "L" level is input to the input terminal (INa) of the inverter circuit U11' and that a voltage signal at the "H" level is input to the input terminal (INb). In this case, the P-channel MOS transistors MP4a and MP5a turn ON, and also the N-channel transistors MN4b and MN5b turn ON.

A current Ipa which flows in the P-channel MOS transistor MP5a and a current Inb which flows in the N-channel MOS transistor MN5b are given by the following formulas:

$$Ipa = (\beta/2)(Vdd-Vt)^2 \qquad (11)$$

$$Inb = (\beta/2)(Vdd-Vt)^2 \qquad (12)$$

where $\beta$ in formula (11) is a transconductance parameter of the P-channel MOS transistor MP5a. Also, $\beta$ in formula (12) is a transconductance parameter of the N-channel MOS transistor MN5b. The transconductance parameters $\beta$ are values which can be set arbitrarily by changing the size of the transistors.

At this time, together with the current I3 which flows in the P-channel transistor MP4a, the following current Ia is output from the output terminal (OUTa) of the inverter circuit U11':

$$Ia = I3 + (\beta/2)(Vdd-Vt)^2 \qquad (13)$$

At this time, together with the current I3 which flows in the N-channel transistor MN4b, the following current Ib is drawn into the output terminal (OUTb) of the inverter circuit U11':

$$Ib = I3 + (\beta/2)(Vdd-Vt)^2 \qquad (14)$$

On the other hand, assuming that a voltage signal at the "H" level is input to the input terminal (INa) of the inverter circuit U11' and that a voltage signal at the "L" level is input to the input terminal (INb), the N-channel MOS transistors MN4a and MN5a turn ON, and also the P-channel MOS transistors MP4b and MP5b turn ON.

Then, the current Ina which flows in the N-channel MOS transistor MN5a and the current Ipb which flows in the P-channel MOS transistor MP5b are given by the following formulas.

$$Ina = (\beta/2)(Vdd-Vt)^2 \qquad (15)$$

$$Ipb = (\beta/2)(Vdd-Vt)^2 \qquad (16)$$

where $\beta$ in formula (15) is a transconductance parameter of the N-channel MOS transistor MN5a and is a value identical to that of the P-channel MOS transistor MP5a.

Also, $\beta$ in formula (16) is a transconductance parameter of the P-channel MOS transistor MP5b and is a value identical to that of the N-channel MOS transistor MN5b.

At this time, together with the current I3 which flows in the N-channel transistor MN4a, the following current Ia is drawn into the output terminal (OUTa) of the inverter circuit U11.

$$Ia = I3 + (\beta/2)(Vdd - Vt)^2 \qquad (17)$$

At this time, together with the current I3 which flows in the P-channel transistor MP4b, the following current Ib is output from the output terminal (OUTb) of the inverter circuit U11.

$$Ib = I3 + (\beta/2)(Vdd - Vt)^2 \qquad (18)$$

Therefore, the propagation delay time τ of the inverter circuit U11' is expressed by the following approximation formula:

$$\tau = C(Vdd/2)/I \qquad (19)$$
$$= C(Vdd/2)/\{I3 + (\beta/2)(Vdd - Vt)^2\}$$

Thus, the oscillation frequency f of the variable frequency type ring oscillator circuit in FIG. 1 is given by the following formula:

$$f = 1/(2K \cdot \tau) \qquad (20)$$
$$= \{I3 + (\beta/2)(Vdd - Vt)^2\}/(K \cdot C \cdot Vdd)$$

In this instance, if we calculate a condition in which ∂f/∂Vdd=0 holds true, the following formula is obtained:

$$\beta = (2 \times I3)/(Vdd^2 - Vt^2) \qquad (21)$$

Namely, by setting the values of the transconductance parameter β of the P-channel MOS transistors MP5a and MP5b and N-channel MOS transistors MN5a and MN5b to satisfy the above formula, it becomes possible to make the rate of variation of the oscillation frequency f against changes in the power supply voltage Vdd be zero. In a ring oscillator circuit designed in this way, even if the power supply voltage Vdd varies somewhat, the oscillation frequency f never varies.

In the embodiments of the ring oscillator circuit, explanations have been made assuming that the oscillation frequency can be varied by controlling the control voltage Vin impressed to the gate of the MOS transistor MN1.

However, the ring oscillator circuit of the present invention can deal with cases in which the oscillation frequency is not variable but fixed. In this case, in the circuits in FIG. 1 and FIG. 2, the MOS transistor MN1 and a resistor R are omitted, and a reference current source is connected instead.

Figure 3:
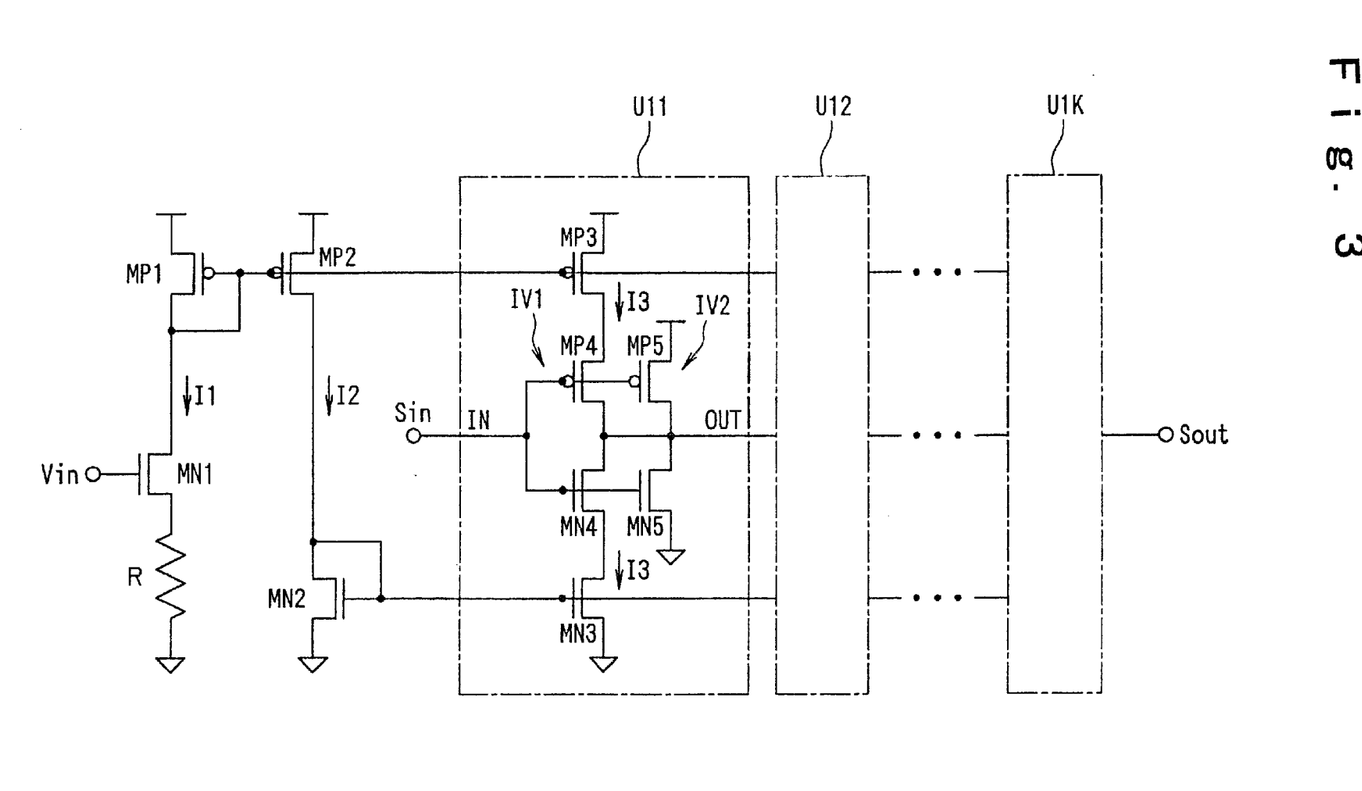
FIG. 3 is a circuit diagram showing the configuration of the first embodiment of the delay circuit of the present invention.

The circuit configuration of the first embodiment of the delay circuit of the present invention is explained hereafter, with reference to FIG. 3.

The first embodiment of the delay circuit comprises a variable delay circuit where K units of inverter circuits U11, U12, ..., U1K are connected in cascade as shown in FIG. 3. The delay circuit is made so that an input signal Sin is input to the first-stage inverter circuit U11, and a delay output signal Sout is taken out from the last-stage inverter circuit U1K.

Although the internal configurations of the inverter circuits U12, ..., U1K are omitted except for the first-stage inverter circuit U11 in FIG. 3, each has an identical circuit configuration to that of the first-stage inverter circuit U11.

In this instance, this first embodiment of the delay circuit has completely the same configuration as the first embodiment of the ring oscillator circuit in FIG. 1, except for the point that the output of the last-stage inverter circuit U1K is not fed back to the first-stage inverter circuit U11. Therefore, the same reference numeral is attached to the same configuration element, and its detailed explanation is omitted.

In the first embodiment of the delay circuit of the present invention having such a configuration, since the propagation delay time τ of the inverter circuit U11 is given by the formula (8), the delay time t of the delay circuit in FIG. 3 becomes as in the following formula:

$$t = K \cdot \tau = K \cdot C(Vdd/2)/\{I3 + (\beta/2)(Vdd - Vt)^2\}$$

If we calculate a condition in which ∂t/∂Vdd=0 holds true, the following formula is obtained:

$$\beta = (2 \times I3)/(Vdd^2 - Vt^2) \qquad (23)$$

Namely, by setting the value of the transconductance parameter of the P-channel MOS transistor MP5 and N-channel MOS transistor MN5 to satisfy the above formula, it becomes possible to make the rate of variation of the delay time t against the change in the power supply voltage Vdd be zero near the operating point. In a variable delay circuit designed in this way, even if the power supply voltage Vdd varies somewhat, the delay time t never varies.

Hence, when the delay circuit of the first embodiment is used in a DLL (delay-locked loop) circuit, for example, and the power supply voltage Vdd varies along with operation of the peripheral circuit, the signal phase never fluctuates. Thus, it is possible to improve the operational reliability of the system that uses the DLL circuit.

Figure 4:
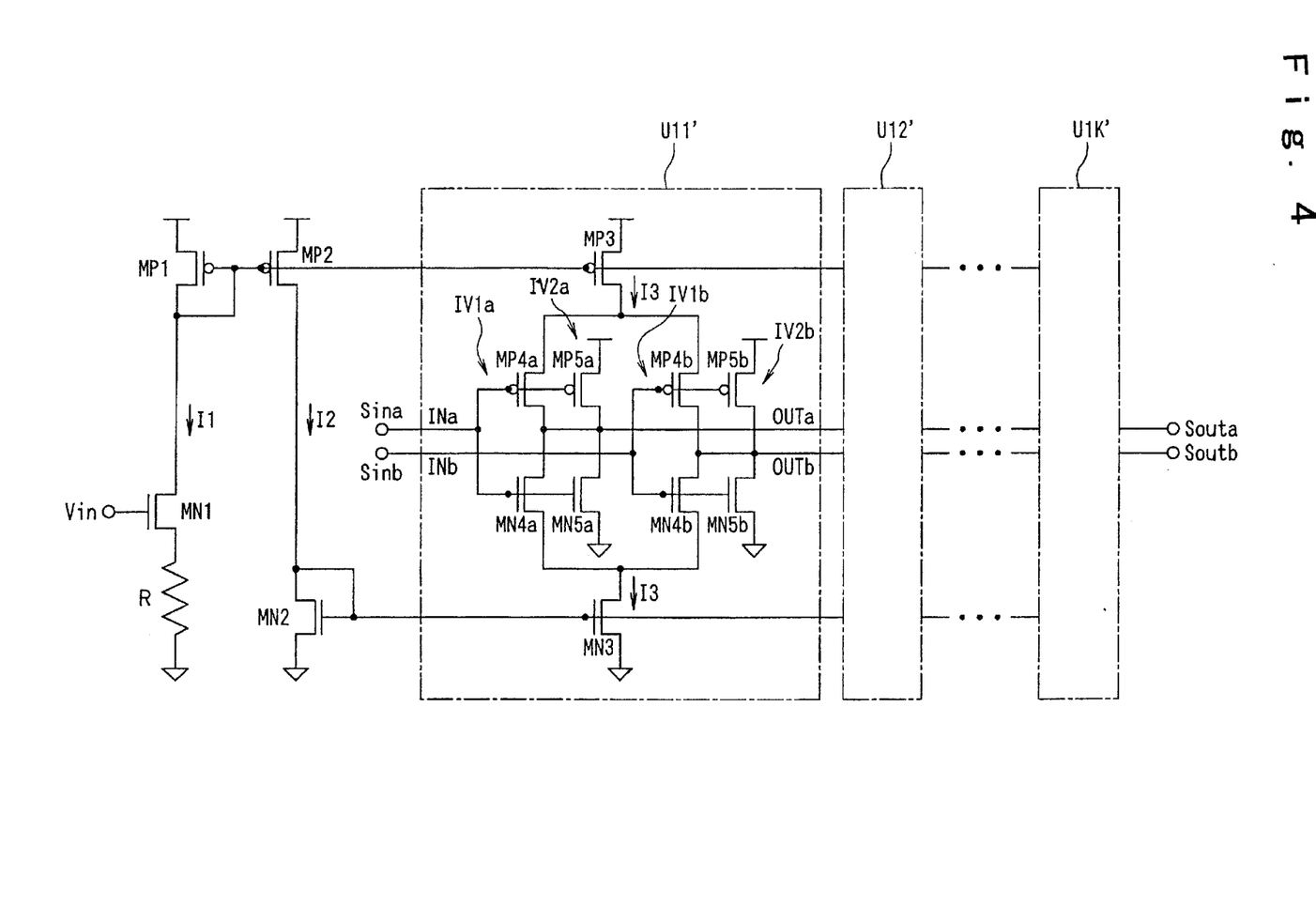
FIG. 4 is a circuit diagram showing the configuration of the second embodiment of the delay circuit of the present invention.

The circuit configuration of the second embodiment of the delay circuit of the present invention is explained hereafter, with reference to FIG. 4.

The second embodiment of the delay circuit consists of a variable delay circuit where K units of inverter circuits U11', U12', ..., U1K' are connected in cascade, as shown in FIG. 4. The delay circuit is made so that differential input signals Sina and Sinb are input to the first-stage inverter circuit U11', and differential delay output signals Souta and Soutb are taken out from the last-stage inverter circuit U1K'.

Although the internal configurations of the inverter circuits U12', ..., U1K' are omitted except for the first-stage inverter circuit U11' in FIG. 4, each has an identical circuit configuration to that of the first-stage inverter circuit U11'.

In this instance, the second embodiment of the delay circuit has completely the same configuration as the second embodiment of the ring oscillator circuit in FIG. 2 except for the point that the output of the last-stage inverter circuit U1K' is not fed back to the first-stage inverter circuit U11'. Therefore, the same reference numeral is attached to the same configuration element, and its detailed explanation is omitted.

In the second embodiment of the delay circuit of the present invention having such a configuration, since the propagation delay time T of the inverter circuit U11' is given by the formula (19), the delay time t of the delay circuit in FIG. 4 becomes as in the following formula:

$$t = K \cdot \tau = K \cdot C(Vdd/2)/\{I3 + (\beta/2)(Vdd - Vt)^2\} \qquad (24)$$

In this instance, if we calculate a condition where ∂t/∂Vdd=0 holds true, the following formula is obtained:

$$\beta = (2 \times I3)/(Vdd^2 - Vt^2) \qquad (25)$$

Namely, by setting the values of the transconductance parameter β of the P-channel MOS transistors MP5a and MP5b and N-channel MOS transistors MN5a and MN5b to satisfy the above formula, it becomes possible to make the rate of variation of the delay time t against changes in the power supply voltage Vdd be zero. In a variable delay circuit designed in this way, even if the power supply voltage Vdd varies somewhat, the delay time t never varies.

In this instance, in the embodiments of the delay circuit, explanations have been made assuming that the delay time can be varied by controlling the control voltage Vin impressed to the gate of the MOS transistor MN1.

However, the delay circuit of the present invention can deal with the case where the delay time is not variable but fixed. In this case, in the circuits in FIG. 3 and FIG. 4, the MOS transistor MN1 and a resistor R are omitted, and a reference current source is connected instead.

As explained above, by the ring oscillator circuit of the present invention, the power supply voltage dependency of the oscillation frequency can be reduced.

Also, by the delay circuit of the present invention, the power supply voltage dependency of the delay time can be reduced. The entire disclosures of Japanese Application Nos. 2001-153247, filed May 22, 2001 and 2002-043313 filed Feb. 20, 2002 are incorporated by reference.

What is claimed is:

1. A ring oscillator circuit including an odd number of inverter circuits connected in a ring shape, the circuit comprising:

a first switching unit including at least two MOS transistors;

a current source for the first switching unit; and a second switching unit installed in parallel to the first switching unit and including at least two MOS transistors, wherein the first switching unit and the second switching unit have input terminals in a common connection and output terminals in a common connection, and wherein transconductance parameters of the MOS transistors in the second switching unit are set so that rate of variation of the oscillation frequency against changes in power supply voltage is approximately zero.

2. A ring oscillator circuit including an odd number of inverter circuits connected in a ring shape, the inverter circuit comprising:

a first CMOS inverter having at least two MOS transistors;

a current source for the first CMOS inverter; and a second CMOS inverter installed in parallel to the first CMOS inverter, the second CMOS inverter having at least two MOS transistors, wherein the first CMOS inverter and the second CMOS inverter have input terminals in a common connection and output terminals in a common connection, and wherein transconductance parameters of the MOS transistors in said second CMOS inverter are set so that rate of variation of the oscillation frequency against changes in power supply voltage is approximately zero.

3. A ring oscillator circuit including an odd number of inverter circuits connected in a ring shape, the inverter circuit comprising:

a first differential inverter including a pair of CMOS inverters having at least two MOS transistors;

a current source for the first differential inverter; and a second differential inverter installed in parallel to the first differential inverter and including a pair of CMOS inverters having at least two MOS transistors, wherein the first differential inverter and the second differential inverter have input terminals in a common connection and output terminals in a common connection, and wherein transconductance parameters of the MOS transistors for the CMOS inverters in the second differential inverter are set so that rate of variation of the oscillation frequency against changes in power supply voltage is approximately zero.

4. A ring oscillator circuit described in claim 1, wherein the current source further comprises a variable current source.

5. A delay circuit including a plurality of inverter circuits connected in cascade, the inverter circuits comprising:

a first switching unit including a least two MOS transistors;

a current source for the first switching unit; and a second switching unit installed in parallel to the first switching unit and including at least two MOS transistors, wherein the first switching unit and the second switching unit have input terminals in a common connection and output terminals in a common connection, and wherein transconductance parameters of the MOS transistors in said second switching unit are set so that rate of variation of the oscillation frequency against changes in power supply voltage is approximately zero.

6. A delay circuit including a plurality of inverter circuits connected in cascade, the inverter circuit comprising:

a first CMOS inverter having at least two MOS transistors;

a current source for the first CMOS inverter; and a second CMOS inverter installed in parallel to the first CMOS inverter, the second CMOS inverter having at least two MOS transistors, wherein the first CMOS and the second CMOS inverter have input terminals in a common connection and output terminals in a common connection, and wherein transconductance parameters of the MOS transistors in said second CMOS inverter are set so that rate of variation of the oscillation frequency against changes in power supply voltage is approximately zero.

7. A delay circuit including a plurality of inverter circuits connected in cascade, the inverter circuits comprising:

a first differential inverter including a pair of CMOS inverters having at least two MOS transistors;

a current source for the first differential inverter;

and a second differential inverter installed in parallel to the first differential inverter and including a pair of CMOS inverters having at least two MOS transistors, wherein the first differential inverter and the second differential inverter have input terminals in a common connection and output terminals in a common connection, and wherein transconductance parameters of the MOS transistors for the CMOS inverters in the second differential inverter are set so that rate of variation of the oscillation frequency against changes in power supply voltage is approximately zero.

8. A delay circuit described in claim 5, wherein the current source further comprises a variable current source.

9. A ring oscillator circuit described in claim 2, wherein the current source further comprises a variable current source.

10. A ring oscillator circuit described in claim 3, wherein the current source further comprises a variable current source.

11. A delay circuit described in claim 6, wherein the current source further comprises a variable current source.

12. A delay circuit described in claim 7, wherein the current source further comprises a variable current source.

* * * * *